(12) United States Patent
Jennings et al.

(10) Patent No.: US 11,012,072 B1
(45) Date of Patent: May 18, 2021

(54) THERMAL LOAD BALANCING OF PROGRAMMABLE DEVICES

(71) Applicant: Xilinx, Inc., San Jose, CA (US)

(72) Inventors: John K. Jennings, Dublin (IE); Brendan Farley, Dublin (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/749,707

(22) Filed: Jan. 22, 2020

(51) Int. Cl.
*H03K 19/003* (2006.01)
*H03K 19/17704* (2020.01)

(52) U.S. Cl.
CPC . *H03K 19/00369* (2013.01); *H03K 19/17708* (2013.01)

(58) Field of Classification Search
None
See application file for complete search history.

(56) References Cited

U.S. PATENT DOCUMENTS

| | | | | |
|---|---|---|---|---|
| 8,996,951 B2* | 3/2015 | Hyde | ............... | G06F 11/0793 714/763 |
| 2006/0239052 A1* | 10/2006 | McGrath | ........... | H01L 27/11898 363/147 |
| 2009/0077558 A1* | 3/2009 | Arakawa | .............. | G06F 1/206 718/102 |
| 2013/0019213 A1* | 1/2013 | Panofsky | ............. | G06F 30/34 716/101 |
| 2013/0305067 A1* | 11/2013 | Lefurgy | ............... | G06F 1/206 713/320 |
| 2019/0041923 A1* | 2/2019 | Atsatt | .............. | H03K 19/0008 |
| 2020/0150734 A1* | 5/2020 | Ma | ........................ | G06F 1/324 |

\* cited by examiner

*Primary Examiner* — Crystal L Hammond
(74) *Attorney, Agent, or Firm* — Paradice and Li LLP (57) ABSTRACT

Method and apparatus for monitoring and reconfiguring a programmable device are disclosed. In some implementations, the programmable device may include a processor and a plurality of satellite monitors to determine operating temperatures at various locations throughout the programmable device. When temperatures of at least some of the satellite monitors exceed a threshold, the processor may reconfigure the programmable device using an alternative configuration. The alternative configuration may provide equivalent functionality with respect to an initial configuration through a different arrangement of functional blocks within the programmable device. The new arrangement of functional blocks may reduce operating temperatures by relocating blocks to different regions of the programmable device.

20 Claims, 8 Drawing Sheets

THERMAL LOAD BALANCING OF PROGRAMMABLE DEVICES

TECHNICAL FIELD

This disclosure relates generally to programmable devices, and specifically to thermal load balancing of a programmable device.

BACKGROUND

Programmable devices are devices that may be programmed by a user to implement a variety of user-specified circuit designs. One example of a programmable device is a field programmable gate array (FPGA). An FPGA may include an array of configurable logic blocks (CLBs), dedicated random access memory blocks (BRAM), input/output blocks (IOBs), digital signal processors (DSPs), a number of processing cores, and other subsystems (such as memory controllers, device management resources, and configuration circuitry) that may be selectively connected together by programmable interconnect structures. Another example of a programmable device is an adaptive compute acceleration platform (ACAP). An ACAP may include scalar engines (compute cores), adaptable engines (programmable logic and memory cells), and intelligent engines (configurable artificial intelligence (AI) and digital signal processing (DSP) engines) that may selectively be connected together with a configurable high-bandwidth network-on-chip (NoC). A user-specified circuit design may be implemented within a programmable device by loading configuration data representative of the user-specified circuit design into configuration registers that collectively determine the functions and operations performed by the various blocks, interconnect structures, and subsystems of the programmable device.

Some portions of a user-specified circuit design may be subject to high temperature operation. For example, some parts of the user-specified design may be associated with intense numerical computations or high speed operations. If some portions of the programmable device are operating at or near a temperature threshold, operations of these portions of the programmable logic device may be "throttled" (e.g., clock reduced) to protect the device from thermal damage. Throttling is undesired since it reduces data throughput and may not be predictable. In extreme cases, throttling may cause one or more portions of the programmable logic device to stop operating completely.

Therefore, there is a need to monitor the temperature of regions of the programmable device and respond to high temperature operations without reducing data throughput.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter. Moreover, the systems, methods and devices of this disclosure each have several innovative aspects, no single one of which is solely responsible for the desirable attributes disclosed herein.

One innovative aspect of the subject matter described in this disclosure can be implemented in a method for operating a programmable device. The method includes determining, through temperature sensors, the temperature associated with one or more regions of the programmable device. Further, the method includes determining an alternative configuration for the programmable device based on the temperature associated with the one or more regions and relocating functions performed by one or more first programmable regions of the programmable device to one or more second programmable regions of the programmable device based on the alternative configuration.

Another innovative aspect of the subject matter described in this disclosure can be implemented in a programmable device. The programmable device includes a plurality of programmable region is configured to perform one or more functions. The programmable device also includes a platform management controller coupled to the plurality of programmable regions and configured to determine a temperature associated with one or more regions of the programmable device, determine an alternative configuration for the programmable device based on the temperature associated with the one or more regions, and relocate functions performed by one or more first programmable regions to one or more second programmable regions based on the alternative configuration.

Another innovative aspect of the subject matter described in this disclosure can be implemented in a programmable device. The programmable device includes a means for determining a temperature associated with one or more regions of the programmable device. The programmable device also includes a means for determining an alternative configuration for the programmable device based on the temperature associated with the one or more regions and a means for relocating functions performed by one or more first programmable logic regions of the programmable device to one or more second programmable logic regions of the programmable device based on the alternative configuration.

BRIEF DESCRIPTION OF THE DRAWINGS

The example implementations are illustrated by way of example and are not intended to be limited by the figures of the accompanying drawings. Like numbers reference like elements throughout the drawings and specification. Note that the relative dimensions of the following figures may not be drawn to scale.

DETAILED DESCRIPTION

Implementations of the subject matter described in this disclosure may be used to reconfigure a programmable device based on operating temperatures. In some implementations, a plurality of temperature sensors may be distributed throughout the programmable device. Reconfiguration of the programmable device may occur when the temperature of one or more regions associated with the temperature sensors exceeds a threshold. In some implementations, the programmable device may be wholly or partially reconfigured through an alternative configuration file. The alternative configuration file may provide similar or equivalent functionality with respect to an original configuration file, however, the functions or operations may be relocated within different regions of the programmable device.

Particular implementations of the subject matter described in this disclosure can be implemented to realize one or more of the following potential advantages. By using a plurality of temperature sensors to measure temperatures in regions distributed across the programmable device, regions associated with higher operating temperatures may be moved or relocated. In this manner, overheating and/or clock throttling may be avoided.

In the following description, numerous specific details are set forth such as examples of specific components, circuits, and processes to provide a thorough understanding of the present disclosure. The term "coupled" as used herein means coupled directly to or coupled through one or more intervening components or circuits. In some aspects, the term "vicinity" as used herein may refer to a distance over which analog signals indicative of operating conditions can be transmitted via relatively short local signal wires with minimal signal degradation. Also, in the following description and for purposes of explanation, specific nomenclature and/or details are set forth to provide a thorough understanding of the example implementations. However, it will be apparent to one skilled in the art that these specific details may not be required to practice the example implementations. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example implementations are not to be construed as limited to specific examples described herein but rather to include within their scope all implementations defined by the appended claims.

Figure 1A:
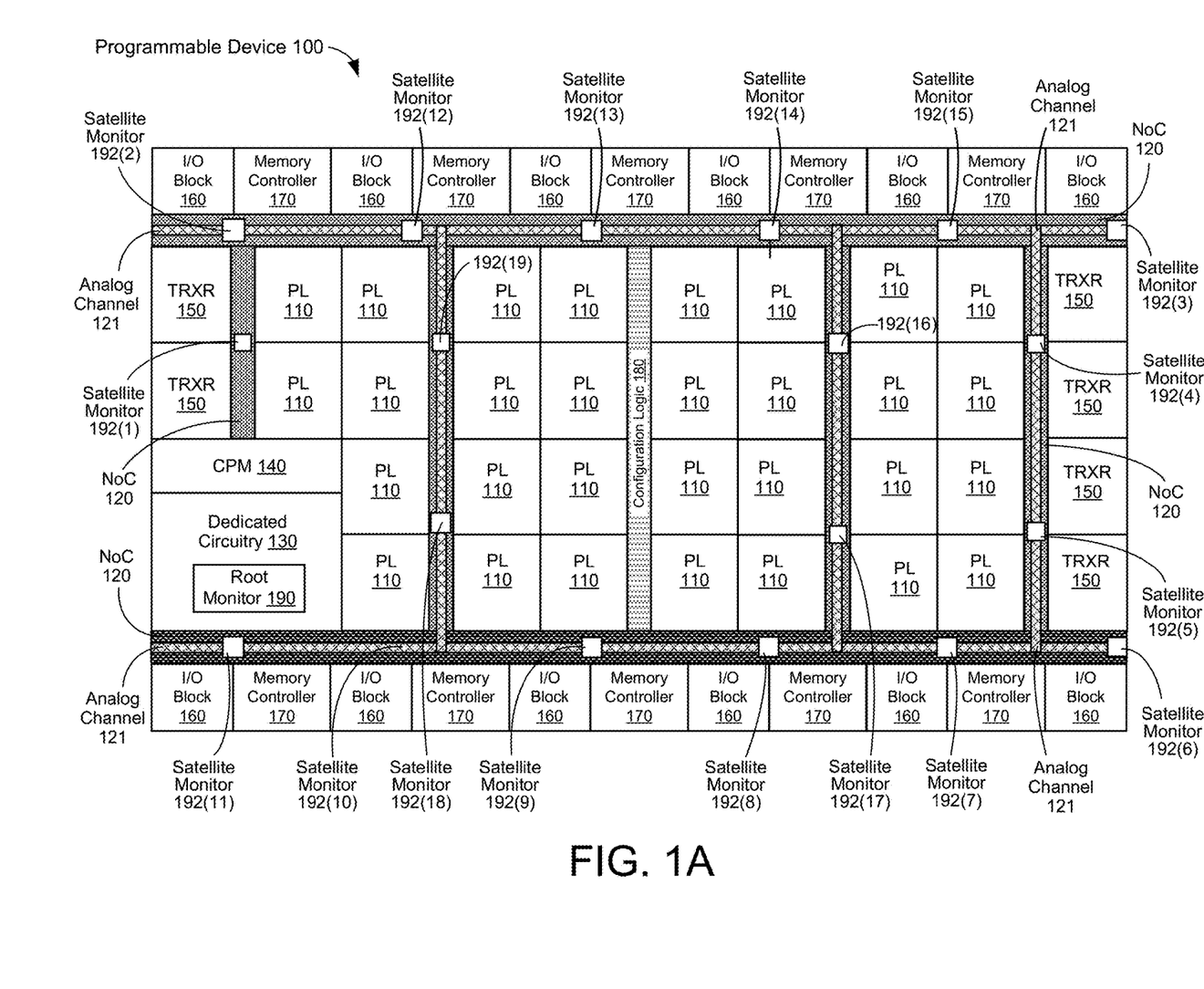
FIG. 1A shows a block diagram of an example programmable device within which various aspects of the present disclosure may be implemented.

FIG. 1A shows a block diagram of an example programmable device 100 within which various aspects of the present disclosure may be implemented. The programmable device 100 may include a number of subsystems such as, for example, programmable logic (PL) 110, a network-on-chip (NoC) interconnect system 120 spanning the PL 110, one or more analog channels 121 spanning the PL 110, dedicated circuitry 130, a CCIX and PCIe Module (CPM) 140, transceiver blocks 150, input/output (I/O) blocks 160, memory controllers 170, configuration logic 180, a root monitor 190, and a plurality of satellite monitors 192(1)-192(19). In one or more implementations, the programmable device 100 may include other subsystems or components not shown in FIG. 1A. Further, although not shown for simplicity, the programmable device 100 may be coupled to a number of peripheral components (such as a high-performance memory device) and/or other devices or chips (such as another programmable device).

The PL 110 includes programmable circuitry that may be configured or programmed to perform a multitude of different user-defined functions or operations. In some implementations, the PL 110 may include a plurality of programmable circuit blocks implemented as repeatable tiles arranged in columns in the programmable device 100, for example, as depicted in FIG. 1A. The programmable circuit blocks, which may also be referred to as programmable fabric sub-regions (FSRs), may each include programmable interconnect circuitry and programmable logic circuitry. In some implementations, the programmable circuit blocks may include (but are not limited to) configurable logic blocks (CLBs), random access memory blocks (BRAM), digital signal processing blocks (DSPs), clock managers, delay lock loops (DLLs), and/or other logic or circuits that can be programmed or configured to implement a user-specified circuit design.

The programmable interconnect circuitry within each of the programmable circuit blocks or tiles may include a plurality of interconnect wires of varying lengths interconnected by programmable interconnect points (PIPs). The interconnect wires may be configured to provide connectivity between components within a particular programmable tile, between components within different programmable tiles, and between components of a programmable tile and other subsystems or devices. The programmable interconnect circuitry and the programmable circuit blocks may be programmed or configured by loading configuration data into configuration registers that define how the programmable elements are configured and operate to implement a corresponding user-specified circuit design. In some aspects, the programmable interconnect circuitry within each of a number of the programmable circuit blocks may form part of a programmable interconnect fabric (not shown for simplicity) that provides block-level and/or device-level signal routing resources for the programmable device 100.

The NoC interconnect system 120, which may be fabricated as part of the programmable device 100, may include any number of horizontal segments and vertical segments (and/or diagonal segments) connected together to implement a high-speed, high-bandwidth programmable signal routing network that can selectively interconnect various device resources (such as the PL 110, the dedicated circuitry 130, the CPM 140, the transceiver blocks 150, the I/O blocks 160, the memory controllers 170, the configuration logic 180, the root monitor 190, and the satellite monitors 192(1)-192(19)) with each other and with other components not shown for simplicity. For the example implementation of FIG. 1A, the NoC interconnect system 120 is shown to include two horizontal segments and four vertical segments. A first horizontal segment extending across the width of the programmable device 100 is positioned along a bottom boundary of the programmable device 100, and a second horizontal segment extending across the width of the programmable device 100 is positioned along the top boundary of the programmable device 100. The four vertical segments extend across the height of the programmable device 100 and are connected to the first and second horizontal segments of the NoC interconnect system 120. In some aspects, the horizontal segments may allow the NoC interconnect system 120 to exchange signals and data with the I/O blocks 160 and memory controllers 170 without any intervening circuits or interfaces, and the vertical segments may allow the NoC interconnect system 120 to exchange signals and data with the transceiver blocks 150, the dedicated circuitry 130, and the CPM 140 without any intervening circuits or interfaces. In other implementations, the NoC interconnect system 120 may include other numbers of horizontal and vertical segments, which in turn may occupy other positions of the programmable device 100. Thus, the particular layout, shape, size, orientation, and other physical characteristics of the example NoC interconnect system 120 depicted in FIG. 1A are merely illustrative of the various implementations disclosed herein.

The NoC interconnect system 120 may be configured to transmit information between various device resources as data packets that can be individually addressed and routed from a source location to a destination location. In some aspects, the data packets transmitted on the NoC interconnect system 120 may be dynamically addressable. In one or more implementations, the NoC interconnect system 120 may employ a suitable data packet protocol (such as token ring protocol) and/or use memory-mapped addresses to route data packets from any number of source locations to any number of destination locations. The data packets may include header information (such as source addresses, destination addresses, and protocol information) that can be used by the NoC interconnect system 120 to route the data packets to their indicated destinations.

Although not shown for simplicity, the NoC interconnect system 120 may also include a scheduler and arbitration logic. The scheduler may be used to schedule the transmission of data packets from a source address to a destination address using one or more physical and/or virtual channels of the NoC interconnect system 120. The arbitration logic may be used to arbitrate access to the NoC interconnect system 120, for example, to minimize collisions and other contention-related latencies. For implementations in which the programmable device 100 is fabricated using stacked silicon interconnect (SSI) technology, the columnal portions of the NoC interconnect system 120 may provide signal connections between adjacent super logic regions (SLRs), for example, to allow configuration data to be routed between master and slave SLRs.

The NoC interconnect system 120 may be programmed by loading configuration data into corresponding configuration registers that define how various switches, interfaces, and routers within or associated with the NoC interconnect system 120 are configured to implement a particular user-specified circuit design. In some implementations, the NoC interconnect system 120 may include a plurality of nodes, ports, or other interfaces (not shown for simplicity) that provide selective connectivity between the NoC interconnect system 120 and the various resources, subsystems, circuits, and other components of the programmable device 100. For example, the NoC interconnect system 120 may allow multiple subsystems of the programmable device 100 to share access to on-chip memory (OCM) resources, processing resources, I/O resources, and/or the transceiver blocks 150. The nodes, ports, or other interfaces of the NoC interconnect system 120 may be programmed to implement a particular connectivity profile by loading configuration data into one or more associated configuration registers.

By selectively interconnecting the various resources, subsystems, circuits, and other components of the programmable device 100 that can demand and use large amounts of data, the NoC interconnect system 120 may alleviate signal routing burdens on local interconnect resources, thereby increasing device performance and allowing for greater configuration flexibility than other programmable devices. Moreover, by providing a high-performance signal routing network having higher data transmission rates and lower error rates than device-level and block-level programmable interconnects, the NoC interconnect system 120 may increase the processing power and data throughput of the programmable device 100 (as compared to other programmable devices).

The analog channels 121 spanning the programmable device 100 may be used to distribute a highly-accurate and temperature-independent reference voltage from the root monitor 190 to each of the plurality of satellite monitors 192(1)-192(19). In some implementations, the analog channels 121 may be adjacent to (or integrated within) corresponding segments of the NoC interconnect system 120. In other implementations, the analog channels 121 may be separate from the NoC interconnect system 120. In some other implementations, the analog channels 121 may be part of a clock distribution network or some other suitable signal interconnect system provided within the programmable device 100.

The dedicated circuitry 130 may include any suitable hard-wired circuits including (but not limited to) processors, serial transceivers, digital signal processors (DSPs), analog-to-digital converters (ADCs), digital-to-analog converters (DACs), device management resources, device monitoring resources, device testing management resources, and so on. In some embodiments, the dedicated circuitry 130 may include a processing system (PS) and a platform management controller (PMC), described with respect to FIG. 2. In some implementations, the PS may include one or more processor cores, cache memory, memory controllers, and unidirectional and/or bidirectional interfaces configurable to couple directly to the I/O pins of the programmable device 100. In some aspects, each processor core may include central processing units (CPU) or scalar processors that can be used for sequential data processing. The PMC may be used for booting and configuring the programmable device 100 based on configuration data (such as a configuration bitstream) provided from external memory. The PMC may also be used to configure the PL 110 and to control various encryption, authentication, root monitoring, and debug capabilities of the programmable device 100.

The CCIX and PCIe module (CPM) 140 may include a number of interfaces that provide connectivity between the programmable device 100 and a number of peripheral components (such as external devices or chips). In some implementations, the CPM 140 may include a plurality of peripheral interconnect express (PCIe) interfaces and cache coherent interconnect for accelerators (CCIX) interfaces that provide connectivity to other devices or chips via the transceiver blocks 150. In some aspects, the PCIe and CCIX interfaces may be implemented as part of the transceiver blocks 150. One example implementation of the CPM 140 is described with respect to FIG. 2.

The transceiver blocks 150 may provide signal connections with one or more other devices or chips (not shown for simplicity) connected to the programmable device 100. The transceiver blocks 150 may include a number of different serial transceivers such as, for example, gigabit serial transceivers (GTs). In some implementations, the transceiver blocks 150 may be implemented as a number of repeatable tiles positioned in various locations along the right and left sides of the programmable device 100, as depicted in FIG. 1A. In other implementations, the transceiver blocks 150 may be positioned in other suitable locations of the programmable device 100. In some aspects, each bank of transceiver circuits within a given transceiver block 150 may include or may be coupled to a corresponding voltage supply, for example, so that each bank of transceiver circuits may be powered using a separate voltage supply.

The I/O blocks 160 are coupled to the programmable device's I/O pins (not shown for simplicity), and may provide I/O capabilities for the programmable device 100. For example, the I/O blocks 160 may receive data from one or more other devices, and may drive the received data to a number of destinations within the programmable device 100. The I/O blocks 160 may also receive data from a number of sources in the programmable device 100, and may drive the received data to one or more other devices via the programmable device's I/O pins. In some implementations, the I/O blocks 160 may be implemented as repeatable tiles. The programmable device 100 may include any suitable number of I/O blocks 160, and therefore the example implementation depicted in FIG. 1A is merely illustrative.

The I/O blocks 160 may include any number of suitable I/O circuits or devices. In some implementations, the I/O blocks 160 may include extremely high-performance I/O (XPIO) circuits, high-density I/O (HDIO) circuits, and multiplexed I/O (MIO) circuits. The XPIO circuits may be optimized for high-performance communications such as providing a high-speed, low latency interface to the memory controllers 170. In one or more implementations, the XPIO circuits may include dedicated memory resources that can be accessed by other subsystems of the programmable device 100 without using the memory controllers 170. The HDIO circuits may provide a cost-effective solution that supports lower speed and higher voltage I/O capabilities (as compared with the XPIO circuits). The MIO circuits may provide general-purpose I/O resources that can be accessed by various subsystems such as, for example, the PL 110, the dedicated circuitry 130, and the CPM 140.

The memory controllers 170 may be used to control access to various memory resources provided within and/or external to the programmable device 100. In some implementations, the memory controllers 170 may be used to access dedicated memory residing in one or more of the I/O blocks 160. The memory controllers 170 may include double data rate v4 (DDR4) memory controllers, high bandwidth memory (HBM) controllers, and/or other suitable memory controllers. In one or more implementations, some or all of the memory controllers 170 may include a scheduler having transaction reordering capabilities that may improve memory access efficiency. In addition, or in the alternative, the repeatable tiles that implement the memory controllers 170 may be different from one another. For example, a first number of the memory controllers 170 may implement DDR4 memory controllers, a second number of the memory controllers 170 may implement LPDDR4 memory controllers, and a third number of the memory controllers 170 may implement HBM controllers.

The programmable device 100 may include any number of I/O blocks 160 and memory controllers 170, and therefore the numbers and positions of the I/O blocks 160 and memory controllers 170 depicted in FIG. 1A are merely illustrative. In some implementations, a first row of I/O blocks 160 and memory controllers 170 may be implemented as repeatable tiles positioned along the bottom edge of the programmable device 100, and a second row of I/O blocks 160 and memory controllers 170 may be implemented as repeatable tiles positioned along the top edge of the programmable device 100. In some implementations, the I/O blocks 160 and memory controllers 170 may be alternately positioned or distributed relative to each other, for example, as depicted in the example of FIG. 1A. In other implementations, a pair of I/O blocks 160 and memory controllers 170 may be implemented within the same repeatable tile.

In some implementations, the programmable device 100 may include one or more columns of connectivity fabric (not shown for simplicity) extending vertically across the height of the programmable device 100 and positioned in a vicinity of the transceiver blocks 150. The connectivity fabric may include one or more hard-wired circuits including (but not limited to) USB controllers, Ethernet MACs, multi-rate (MR) Ethernet MACs (MRMACs), PCIe controllers, CCIX controllers, and/or other components to provide connectivity between the transceiver blocks 150 and the PL 110.

The configuration logic 180 may be used to load configuration data (such as a configuration bitstream) from an external memory and route portions (such as frames, words, bytes, and/or bits) of the configuration data to the appropriate configuration registers that define how the various programmable resources of the programmable device 100 are configured. The configuration logic 180 may also be used to partially re-configure the programmable device 100 and/or to internally reconfigure one or more portions of the programmable device 100. In some implementations, the configuration logic 180 may include configuration registers, boundary-scan test circuitry (such as TAP controller circuitry), encryption circuitry to encrypt bitstreams of configuration data read out of the programmable device 100, and decryption circuitry to decrypt bitstreams of configuration data loaded into the programmable device 100.

Although not shown for simplicity, the programmable device 100 may include an interface between the programmable fabric and each of the rows of I/O blocks 160 and memory controllers 170 positioned on the boundary of the programmable device 100. This interface, which may be referred to herein as a Boundary Logic Interface (BLI), may allow large and complex external devices (such as HBM) to appear as much smaller blocks (such as a CLB) in the programmable fabric of the programmable device 100. In some implementations, the BLI may be arranged in rows positioned at the top and bottom boundaries or edges of the programmable fabric. In this manner, the BLI may be used to route signals between columnar logic structures (such as a CLB column or a DSP column) and rows of I/O resources (such as the I/O blocks 160).

In accordance with various aspects of the present disclosure, the programmable device 100 may include a monitoring system that can measure a temperature of a plurality of selected regions throughout the programmable device 100, concurrently. The monitoring system can use the measured temperature to determine whether the associated region is operating at or above a temperature threshold. In some implementations, when the monitoring system determines that one or more regions are operating at or above a temperature threshold, the monitoring system may cause at least a partial reconfiguration of the programmable device 100. For example, in response to determining that one or more regions are operating at or above the temperature threshold, the monitoring system may cause the programmable device 100 to be loaded with an alternative configuration. The alternative configuration may provide a similar or equivalent functionality with respect to an initial configuration, while relocating one or more design regions to reduce heat build-up and associated with one or more regions.

The monitoring system may include (or may be formed by) the root monitor 190 and the satellite monitors 192(1)-192(19). The root monitor 190 may be coupled to the NoC interconnect system 120 and to the analog channels 121, and may include circuitry configured to generate a highly-accurate and temperature-independent reference voltage ($V_{REF}$). In some implementations, the temperature-independent reference voltage may be distributed to each of the satellite monitors 192(1)-192(19) via the one or more analog channels 121, thereby eliminating the need for each of the satellite monitors 192(1)-192(19) to generate its own highly-accurate and temperature-independent reference voltage.

Although not shown in FIG. 1A for simplicity, each of the satellite monitors 192(1)-192(19) may include one or more sensors and an analog-to-digital converter (ADC). For each satellite monitor 192, the one or more sensors may measure the operating conditions of various metal-based electrical conductors and components within an associated region of the programmable device 100 in a vicinity of the satellite monitor 192, and the ADC may convert analog signals generated by the one or more sensors into digital data indicative of the measured operating conditions.

Note that FIG. 1A is intended to illustrate only one example architecture of the programmable device 100. For example, the numbers of logic blocks in a column (or row), the relative width of the columns (or rows), the number and order of columns (or rows), the types of logic blocks included in the columns (or rows), the relative sizes of the logic blocks, and other architectural aspects shown in FIG. 1A are merely illustrative of the various implementations of the inventive subject matter disclosed herein.

Figure 1B:
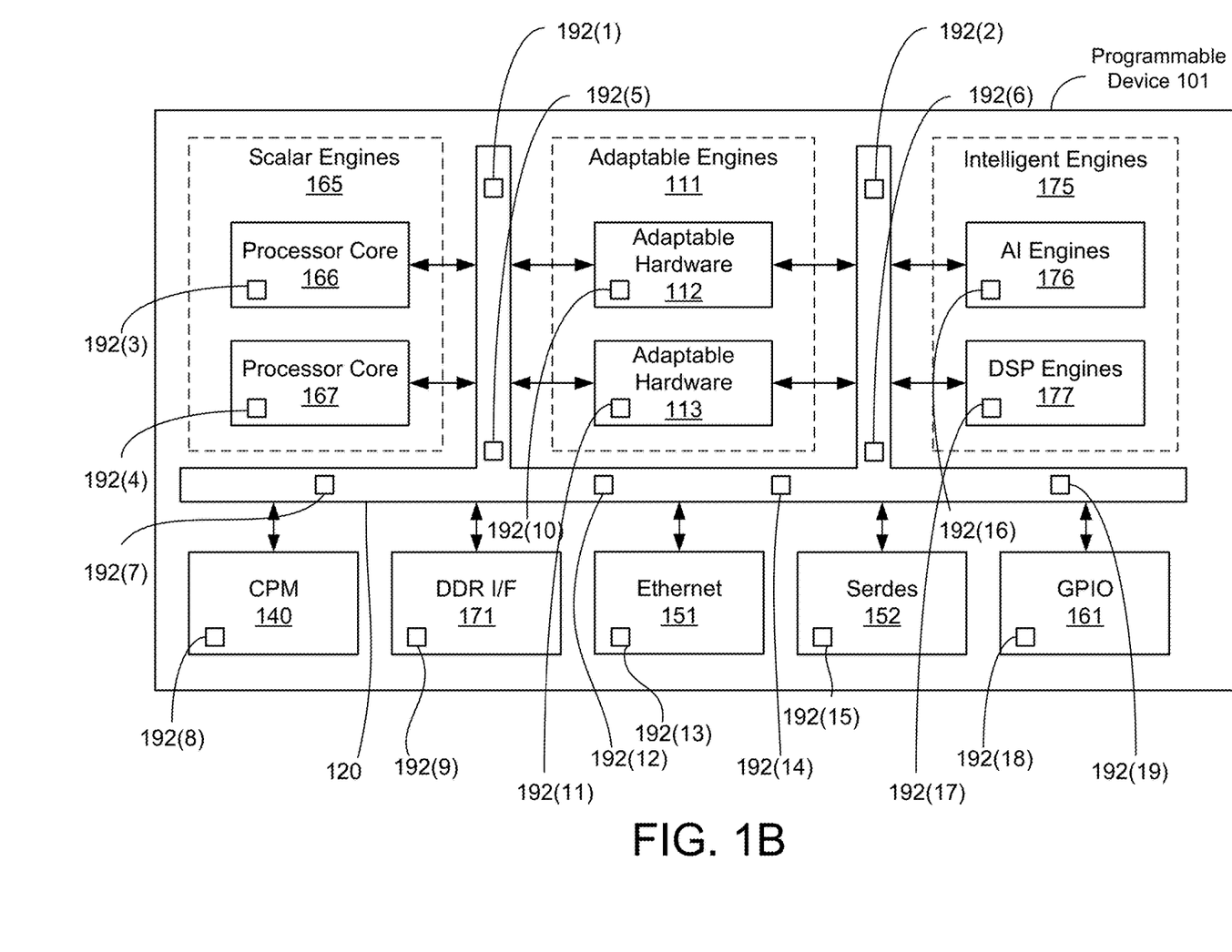
FIG. 1B shows a block diagram of another example programmable device within which various aspects of the present disclosure may be implemented.

FIG. 1B shows a block diagram of another example programmable device 101 within which various aspects of the present disclosure may be implemented. The programmable device 101 may be similar to the programmable device 100 of FIG. 1A and may share a number of subsystems in common. For example, the NoC interconnect system 120, the CPM 140, and the plurality of satellite monitors 192(1)-192(19) may be as described with respect to FIG. 1A. In addition, the programmable device 101 may include scalar engines 165, adaptable engines 111, intelligent engines 175, a double data rate (DDR) memory interface 171, an ethernet block 151, a serializer/deserializer (serdes) block 152, and a general purpose input-output (GPIO) block 161. In some implementations, the programmable device 101 may be referred to as a system-on-a-chip (SoC).

The DDR memory interface 171 may be coupled to DDR memory (not shown for simplicity) to enable storage and retrieval of data for the programmable device 101. In some implementations, the DDR memory interface 171 may include DDR memory bus transceivers and a DDR memory controller (both not shown for simplicity) to interface with and control DDR memory circuits. The ethernet block 151 may include physical ethernet transceivers and an ethernet control module (not shown for simplicity) to enable data to be transmitted and received using one or more ethernet protocols.

The serdes block 152 may include one or more serializer/deserializer circuits to enable high-speed serial data transfer to and from the programmable device 101. By way of example and not limitation, the serdes block 152 may provide 56G and 112G serdes interfaces for serial data transfer. Other serdes interfaces are possible. The GPIO block 161 may include one or more circuits to support one or more pins that may be used to transmit (output) and/or receive (input) digital or analog signals.

The scalar engines 165 may include processor cores 166 and 167. Although two processor cores 166 and 167 are shown, the scalar engines 165 may include any feasible number of processor cores. In some embodiments, the processor cores 166 and 167 may include Advanced RISC Machine (ARM) cores, however other feasible processor cores are possible. The processor cores 166 and 167 may be configured to perform any number of processing tasks including numeric and/or procedural processing tasks.

The adaptable engines 111 may include adaptable hardware blocks 112 and 113. Although two adaptable hardware blocks 112 and 113 are shown, the adaptable engines 111 may include any feasible number of adaptable hardware blocks. In some embodiments, the adaptable hardware blocks 112 and 113 may include any feasible number programmable logic cells and memory cells. The programmable cells and memory cells may be configured to implement conventional programmable logic and/or FPGA designs as well as to form customized memory hierarchies for use within the programmable device 101.

The intelligent engines 175 may include an artificial intelligence (AI) engine block 176 and a DSP engine block 177. In other embodiments, the intelligent engines 175 may include any number of AI engine blocks 176 and any number of DSP engine blocks 177. The AI engine block 176 may include any feasible number of AI inference engines that may be configured to perform any number of inference processing and/or machine learning tasks. The DSP block 177 may include any feasible number of DSP processing cores that may be configured to perform any number of DSP tasks.

As described above, the NoC interconnect system 120 may provide selective connectivity between the NoC interconnect system 120 and the various resources, subsystems, circuits, and other components of the programmable device 101. For example, the NoC interconnect system 120 may enable data transfer between the scalar engines 165, the adaptable engines 111, the intelligent engines 175, the CPM 140, the DDR memory interface 171, the ethernet block 151, the serdes block 152, and the GPIO block 161.

Each of the plurality of satellite monitors 192(1)-192(19) may include one or more sensors, including temperature sensors. As shown, the plurality of satellite monitors 192(1)-192(19) may be distributed throughout various regions of the programmable device 101. In some implementations, one or more of the plurality of satellite monitors 192(1)-192(19) disposed within the scalar engines 165, the adaptable engines 111 and the intelligent engines 175 as well as within the NoC interconnect system 120 and various other blocks.

Figure 2:
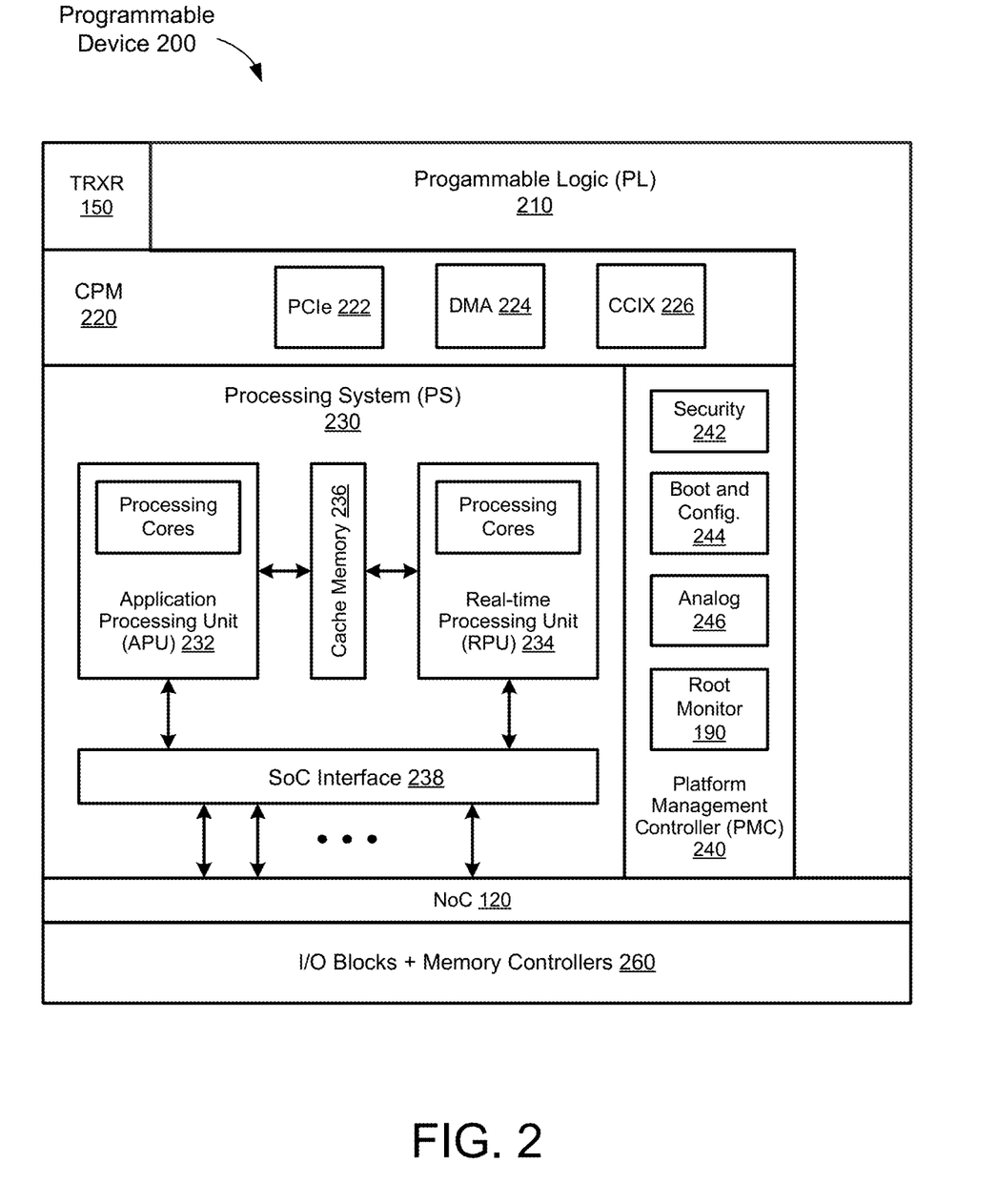
FIG. 2 shows a functional block diagram of a programmable device that may be one example of the programmable device of FIG. 1A or FIG. 1B, in accordance with some implementations.

FIG. 2 shows a functional block diagram of a programmable device 200 that may be one example of the programmable device 100 of FIG. 1, in accordance with some implementations. The programmable device 200 is shown to include a transceiver block 150, programmable logic (PL) 210, a CPM 220, a processing system (PS) 230, a platform management controller (PMC) 240, and I/O blocks+memory controllers 260. The PL 210, which may be one implementation of the PL 110 of FIG. 1, may be adjacent to and directly connected to the transceiver blocks 150, the CPM 220, the PMC 240, and the NoC interconnect system 120. The I/O blocks+memory controllers 260, which may be one implementation of the I/O blocks 160 and memory controllers 170 of FIG. 1, may be implemented as a plurality of repeatable tiles arranged along any suitable edge of the programmable device 200.

The CPM 220, which may be one implementation of the CPM 140 of FIG. 1, may provide interfacing capabilities for a number of different bus standards. In some implementations, the CPM 220 may include a peripheral component interconnect express (PCIe) interface 222, a direct memory access (DMA) circuit 224, and a cache coherent interconnect for accelerators (CCIX) interface 226. The PCIe interface 222 may be used to exchange data between the PS 230 and one or more other devices or chips via the transceiver blocks 150 according to a PCI protocol. Similarly, the CCIX interface 226 may be used to exchange data between the PS 230 and one or more other devices or chips via the transceiver blocks 150 according to a CCIX protocol.

The PS 230 may provide dedicated data processing capabilities for the programmable device 200, and is shown to include an application processing unit (APU) 232, a real-time processing unit (RPU) 234, cache memory 236, and a system-on-a-chip (SoC) interface 238. Although not shown for simplicity, the PS 230 may also include peripherals for communication standards (such as Ethernet and USB 2.0 interfaces) and various controllers (such as SPI, I2C, UART, and CAN-FD controllers). The APU 232 and the RPU 234 may each include one or more processing cores (such as CPUs) that can provide dedicated scalar processing capabilities for the programmable device 200. In some aspects, the PS 230 may be selectively connected to other subsystems of the programmable device 200 by the programmable interconnect fabric and the NoC interconnect system 120.

In some implementations, the APU 232 may include a multi-core ARM processor that supports hardware virtualization, and may have a built-in interrupt controller and snoop control unit. The interrupt controller may support virtual interrupts, and the snoop control unit may be used maintain coherency between one or more caches used and/or shared by APU 232 and RPU 234. The APU 232 may communicate with other components of the PS 230 using an AXI coherent extension (ACE) port, and may communicate with the PL 210 using an accelerator coherency port (ACP). In some implementations, the RPU 234 may include a multi-core ARM processor that supports real-time data processing, may include tightly coupled memory (TCM) interface for real-time single cycle access, and may have a dedicated interrupt controller and floating point unit. The RPU 234 may communicate with other components of the PS 230 and/or with the PL 210 using AXI ports.

The cache memory 236 may be any suitable high-speed cache that allows for shared access by the APU 232 and the RPU 234. The SoC interface 238 may provide connectivity between various resources of the PS 230 and the NoC interconnect system 120.

The PMC 240 may include security circuitry 242, booting and reconfiguration circuitry 244, analog circuitry 246, and the root monitor 190 of FIG. 1. The security circuitry 242 may provide data encryption/decryption capabilities and other security features. The booting and reconfiguration circuitry 244 may provide a multi-stage boot process that supports both a non-secure and a secure boot. The analog circuitry 246 may include any suitable analog circuit components. Further, although not shown in FIG. 2 for simplicity, the PMC 240 may include test and debugging resources (such as JTAG circuitry), external flash memory interfaces, and other components or circuits. In some implementations, the PMC 240 may allow portions of the PL 210 to be reconfigured using a partial reconfiguration operation. For example, a new configuration bitstream for a portion of the PL 210 can be loaded from the PS 230 via either a primary or secondary boot interface (such as PCIe or Ethernet), and then stored in configuration registers associated with the portions of the PL 210 to be reconfigured. The ability to allow for partial reconfiguration of one or more portions of the PL 210 may allow a user to more quickly reconfigure the programmable device 200 to reflect changes or updates to the user-specified circuit design (such as compared with other programmable devices). In some implementations, the programmable device 200 may be wholly or partially reconfigured dynamically while the programmable device 200 is in operation. In some other implementations, the programmable device 200 may be reconfigured prior to operation.

As described above, the programmable device 100 of FIG. 1A, the programmable device 101 of FIG. 1B, and the programmable device 200 of FIG. 2 are example programmable devices that include multiple programmable regions that may be configured according to a user-specified circuit design. Other programmable devices are possible, but are not shown here for simplicity. For example, other programmable devices may include some or all of the programmable or configurable elements, blocks, and/or regions of the programmable devices 100, 101, and 200. In one implementation, a programmable device may simply include a plurality programmable logic 110 regions as described with respect to the programmable device 100. In another implementation, a programmable device may include a plurality of processor cores such as the processor cores 166 and/or 167 as described with respect to the programmable device 101. Thus, a programmable device may include a plurality of any feasible programmable and/or configurable regions.

Figure 3:
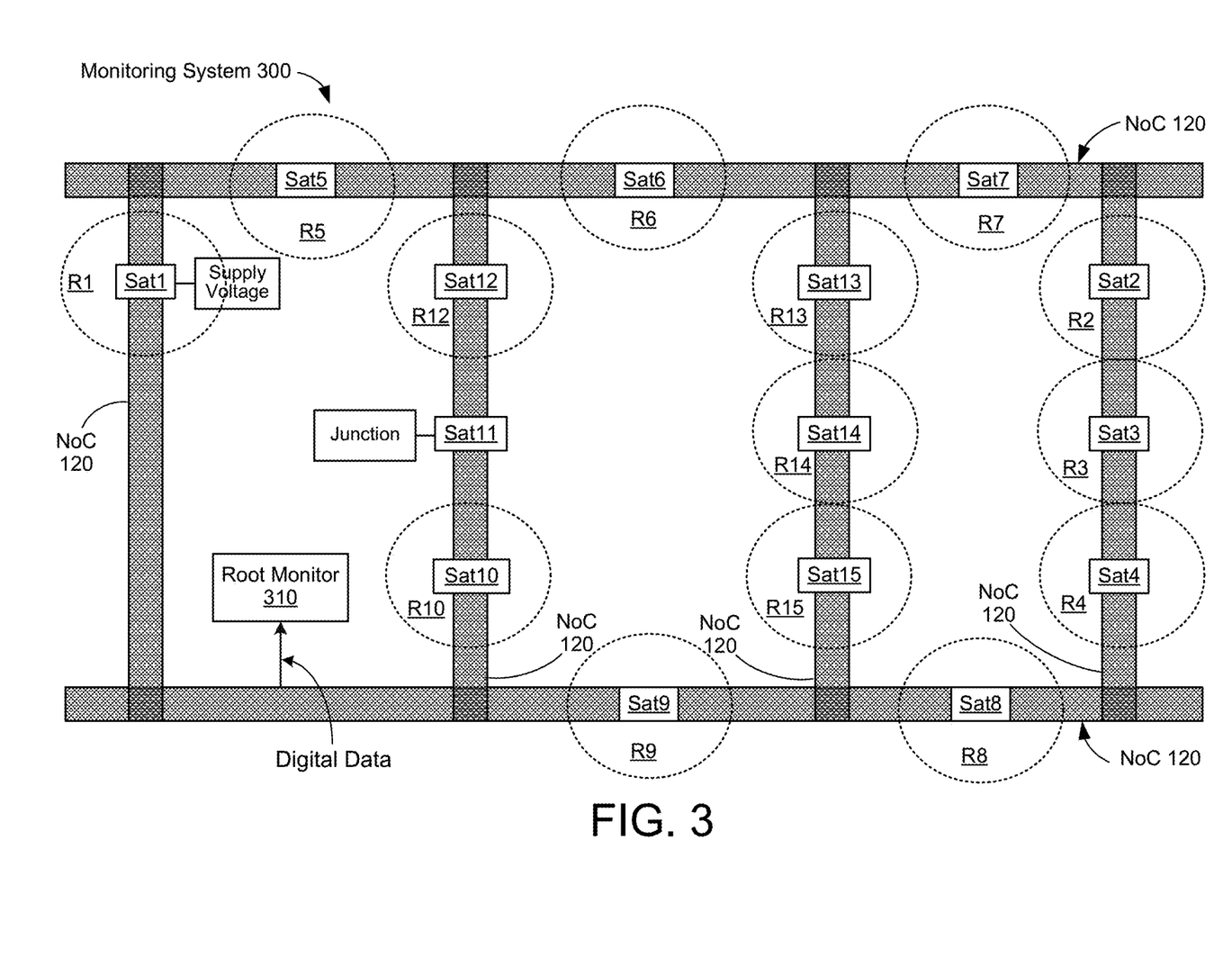
FIG. 3 shows a functional block diagram of a monitoring system, in accordance with some implementations.

FIG. 3 shows a functional block diagram of a monitoring system 300, in accordance with some implementations. The monitoring system 300, which may be implemented in the programmable device 100 of FIG. 1, may include a root monitor 310 and a plurality of satellite monitors SAT1-SAT15. The root monitor 310, which may be one implementation of the root monitor 190 of FIG. 1, may be coupled to the satellite monitors SAT1-SAT15 via the NoC interconnect system 120.

The satellite monitors SAT1-SAT15 may be distributed in various locations across the programmable device 100, and may be configured to measure the operating conditions of electrical conductors and components within a corresponding one of associated regions R1-R15 of the programmable device 100. In some implementations, each of the satellite monitors SAT1-SAT15 may include at least a temperature sensor. The temperature sensors may detect temperatures (such as junction temperatures, die temperatures, circuit temperatures, and so on) of an associated circuit or component in the vicinity of the satellite monitor. In some implementations, the sensors within the satellite monitors SAT1-SAT15 may generate analog signals indicative of the measured operating conditions of respective regions R1-R15, and ADCs within the satellite monitors SAT1-SAT15 may convert the analog signals into digital data. The digital data may be routed from each of the satellite monitors SAT1-SAT15 to the root monitor 310 via the NoC interconnect system 120 (or any other suitable signal routing resources available to the satellite monitor 400).

The root monitor 310 may use the digital data received from the satellite monitors SAT1-SAT15 to determine a temperature distribution associated with the programmable device 100. In some implementations, the root monitor 310 may determine whether one or more regions R1-R15 are operating at a temperature greater than a threshold. In some implementations, the root monitor 310 may signal an external device or memory to download and configure the programmable device in an alternative configuration. In some other implementations, the root monitor 310 may store one or more alternative configurations. Thus, when the root monitor 310 determines that one or more regions are operating at a temperature greater than a threshold, the root monitor 310 may select an alternative configuration for the programmable device 100. The alternative configuration may provide an equivalent functionality to an initial configuration while redistributing or relocating logic within the programmable device 100 to reduce hot spots and operating temperatures.

Figure 4:
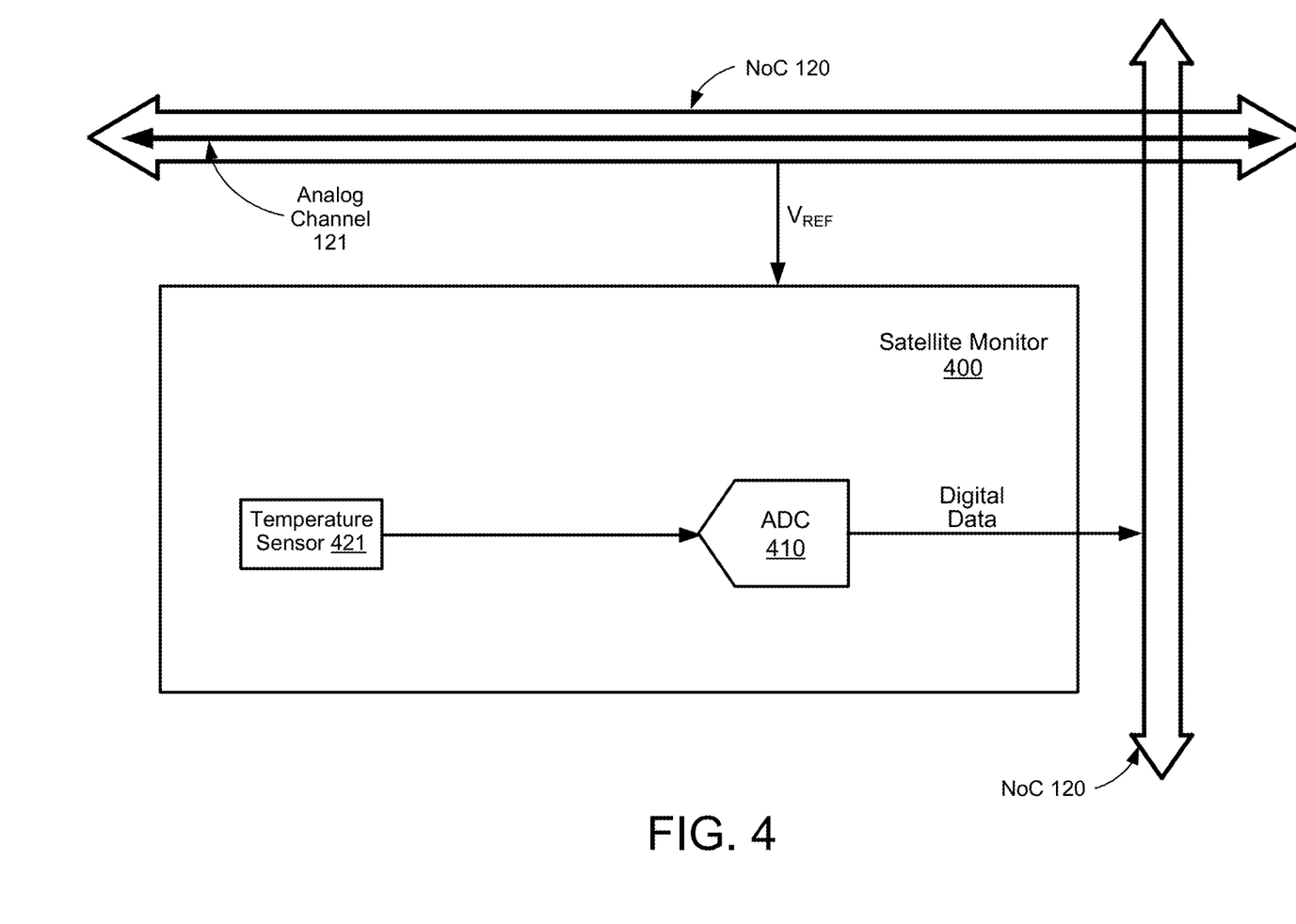
FIG. 4 shows a block diagram of an example satellite monitor, in accordance with some implementations.

FIG. 4 shows a block diagram of an example satellite monitor 400, in accordance with some implementations. The satellite monitor 400, which may be one example of any number of the satellite monitors 192(1)-192(19) of FIG. 1 or the satellite monitors SAT1-SAT15 of FIG. 3, includes an ADC 410 and a temperature sensor 421. The satellite monitor 400 may be coupled to the NoC interconnect system 120. In some implementations, the satellite monitor 400 may receive a temperature-independent reference voltage $V_{REF}$ via the one or more analog channels 121. The temperature sensor 421 may be coupled to the ADC 410. In some implementations, the ADC 410 may be controlled at least in part by the root monitor 190 of FIG. 1 or the root monitor 310 of FIG. 3. The ADC 410 may convert analog signals indicative of a temperature from the temperature sensor 421 into digital data that can be provided to the root monitor 190, for example, via the NoC interconnect system 120.

Figure 5:
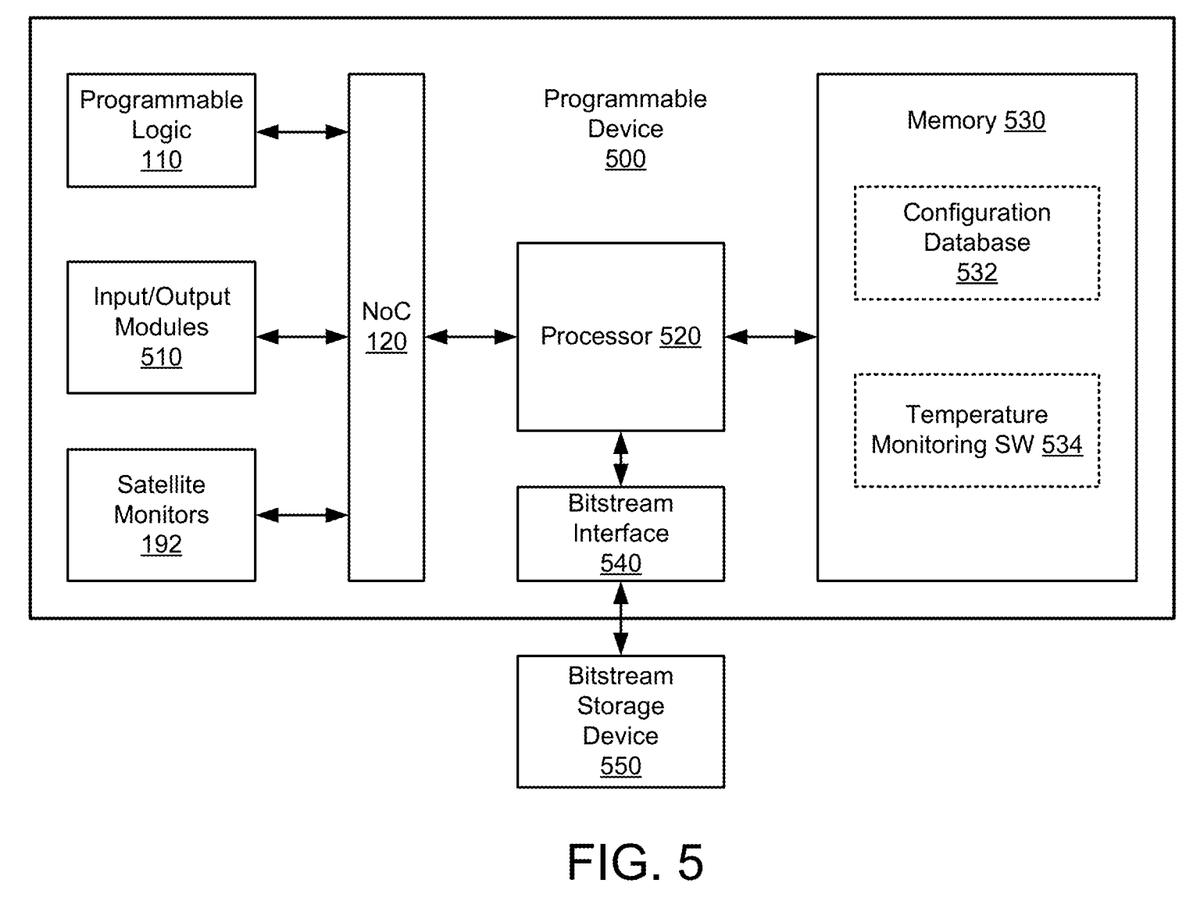
FIG. 5 shows a block diagram of an example programmable device, in accordance with some implementations.

FIG. 5 shows a block diagram of an example programmable device 500, in accordance with some implementations. The programmable device 500, which may be an implementation of the programmable device 100 of FIG. 1, may include PL 110, the NoC interconnect system 120, satellite monitors 192, input/output modules 510, a processor 520, a memory 530, and a bitstream interface 540. The example of FIG. 5 depicts the PL 110, the input/output modules 510, the satellite monitors 192, and the processor 520 coupled to each other via the NoC interconnect system 120. In other implementations, one or more of the PL 110, the input/output modules 510, the satellite monitors 192, and the processor 520 may be coupled to each using other suitable signal routing resources of the programmable device 500. In addition, or in the alternative, the programmable device 500 may include additional components, devices, functional units and the like not shown here for simplicity. In some implementations, the processor 520 may be included in the PMC 240 of FIG. 2.

Each of the satellite monitors 192 may monitor and/or measure operating conditions, including operating temperatures, of an associated region of the programmable device 500. In some aspects, the satellite monitors 192 may be an implementation of the satellite monitors SAT1-SAT15 of FIG. 3 or the satellite monitor 400 of FIG. 4. The input/output modules 510 may include hardware, software, and/or firmware to enable data to be transmitted and received from sources external to the programmable device 500.

The processor 520 may be any suitable one or more processors capable of executing scripts or instructions of one or more software programs stored in the memory 530. In some implementations, the processor 520 may be or include one or more microprocessors providing the processor functionality and external memory providing at least a portion of machine-readable media. In other implementations, the processor 520 may be or include an Application Specific Integrated Circuit (ASIC) with the processor, the bus interface, the user interface, and at least a portion of the machine-readable media integrated into a single chip or device.

The memory 530 may include a configuration database 532 that stores one or more configuration files of the programmable device 500. As described herein, the programmable device 500 may be configured to operate in accordance with a user-specified design by loading configuration data (included in a configuration file) into corresponding configuration registers. In some implementations, a plurality of configuration files may be stored in the configuration database 532. In other implementations, a plurality of configuration files may be stored in a bitstream storage device 550 coupled to the processor 520 by the bitstream interface 540. The bitstream storage device 550 may be a memory device, such as flash memory, electrically erasable memory, or any other feasible memory device providing persistent data storage. Thus, to configure the programmable device 500, processor 520 may retrieve a configuration file from the configuration database 532 or from the bitstream storage device 550 through the bitstream interface 540.

The memory 530 may also include a non-transitory computer-readable storage medium (e.g., one or more nonvolatile memory elements, such as EPROM, EEPROM, Flash memory, a hard drive, etc.) that may store a temperature monitoring software (SW) module 534. The temperature monitoring SW module 534 may include instructions that, when executed by the processor 520, cause the programmable device 500 to perform the corresponding functions. The non-transitory computer-readable medium of the memory 530 thus includes instructions for performing all or some of the operations of FIG. 7.

In some implementations, the temperature monitoring SW module 534 may monitor the temperature of one or more regions of the programmable device 500 by, for example, comparing temperature readings from the satellite monitors 192 to respective temperature thresholds. If a temperature reading exceeds a threshold, the processor 520 may reconfigure the programmable device 500 by selecting and loading an alternative configuration file from the configuration database 532 or the bitstream storage device 550. In some implementations, the temperature monitoring SW module 534 may periodically monitor the temperatures. For example, the temperature may be determined every millisecond, every second, every minute, or periodic with any other feasible time period.

In some implementations, alternate configurations of the user-specified design may be designed by the user and stored in the configuration database 532 or the bitstream storage device 550. For example, a user may, through a design tool, capture several different implementations of a user-specified design. Each implementation may include a different physical assignment of processing tasks to different physical regions of the programmable logic device 500. Thus, each implementation may be associated with a different temperature profile.

Using an alternative configuration file may provide a similar or equivalent functionality to an initial configuration file while enabling the reduction of the operating temperature by moving or relocating different functions of the user-specified design to different locations or regions within the programmable device 500. In some aspects, the processor 520 may cycle through a plurality of alternative configurations until the temperature of all the regions is decreased to less than a threshold.

For example, during operation, the satellite monitors 192 may monitor temperature readings associated with different regions of the programmable device 500. If one or more regions exceed a temperature threshold, the processor 520 may select an alternative configuration with which to reconfigure the programmable device 500. In some implementations, the reconfiguration may be a partial reconfiguration where some, but not all, of the programmable device 500 is reconfigured. In this manner, portions of the programmable device 500 may continue to function while other portions are reconfigured.

In some implementations, the processor 520 may autonomously provide one or more alternative configurations (by generating one or more bitstreams) for the programmable device 500 based on the regions that exceed a temperature threshold. For example, the processor 520 may autonomously relocate one or more design regions that are associated with high temperatures to regions of the programmable device 500 that may be lower in temperature.

Figure 6:
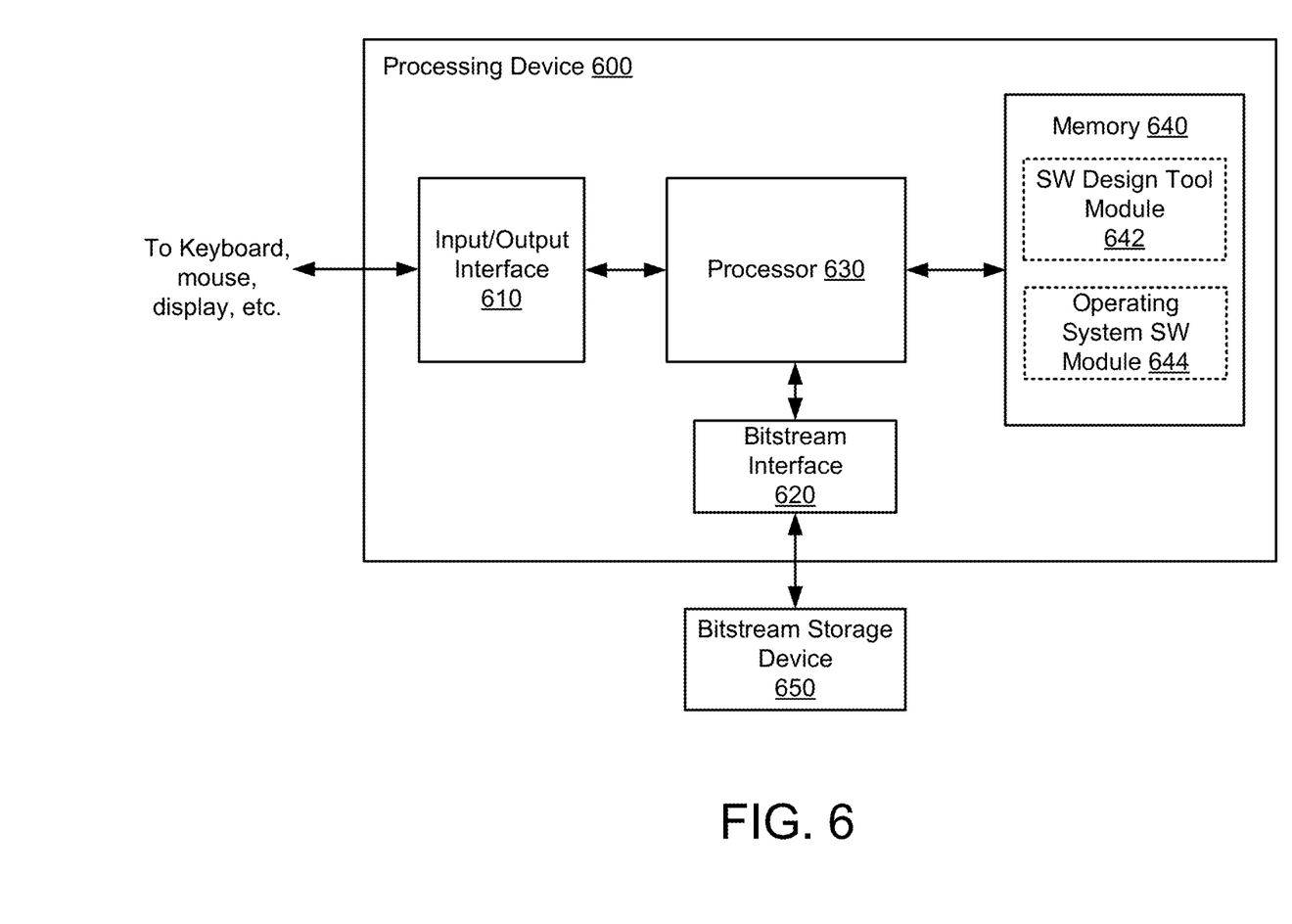
FIG. 6 shows a block diagram of an example processing device, in accordance with some implementations.

FIG. 6 shows a block diagram of an example processing device 600, in accordance with some limitations. The processing device 600 may receive user input and generate a bitstream to configure one or more programmable devices, such as the programmable device 500 of FIG. 5. In some implementations, the processing device 600 may generate one or more bitstreams to implement one or more alternate configurations. The processing device 600 may include an input/output interface 610, a bitstream interface 620, a processor 630, and a memory 640.

The input/output interface 610 may include hardware, software, and/or firmware to enable the user to provide data to and receive data from the processing device 600. For example, the input/output interface 610 may be coupled to one or more keyboards, mice, touchpads, or any other feasible devices to receive user input. The input/output interface 610 may also be coupled to one or more display devices to provide textual or graphic information to the user regarding the user's design and the design process. In some implementations, the input/output interface 610 may include a network interface. The network interface may enable user input and output data to be transferred via network, such as a wired or wireless network.

The bitstream interface 620 may enable a bitstream generated by a software design tool module to be delivered to a programmable device through a bitstream storage device 650. In some implementations, the bitstream storage device 650 may be an implementation of the bitstream storage device 550 of FIG. 5.

The memory 640 may include a non-transitory computer-readable storage medium (e.g., one or more nonvolatile memory elements, such as EPROM, EEPROM, Flash memory, a hard drive, etc.) that may store the following software modules:
 a software (SW) design tool module 642 to capture a user's design for a programmable logic device; and
 an operating system SW module 644 to manage one or more operations of the processing device 500.

The processor 630, which is coupled to the input/output interface 610, the bitstream interface 620, and the memory 640, may be any one or more suitable processors capable of executing scripts or instructions of one or more software programs stored in the processing device 600 (e.g., within the memory 640).

The processor 630 may execute the SW design tool module 642 to receive and capture a user-specified design for one or more programmable devices and also to generate a related bitstream to configure the programmable devices to implement the design. The processor 630 may also execute the SW design tool module 642 to relocate or copy more or more design partitions, features, elements and the like from a first region or section of a programmable device to another region or section to create alternative configurations of the user-specified design. The alternative configurations may be designed interactively by the user or may be created without user input by the processor 630.

The processor 630 may execute the operating system SW module 644 to manage one or more operations of the processing device 600. For example, the processor 630 may execute the operating system SW module 644 to receive and output user data through the input/output interface 610. The processor 630 may also execute the operating system SW module 644 to write out bitstreams generated by executing the SW design tool module 642. The bitstreams may be written to the bitstream storage device 650.

Figure 7:
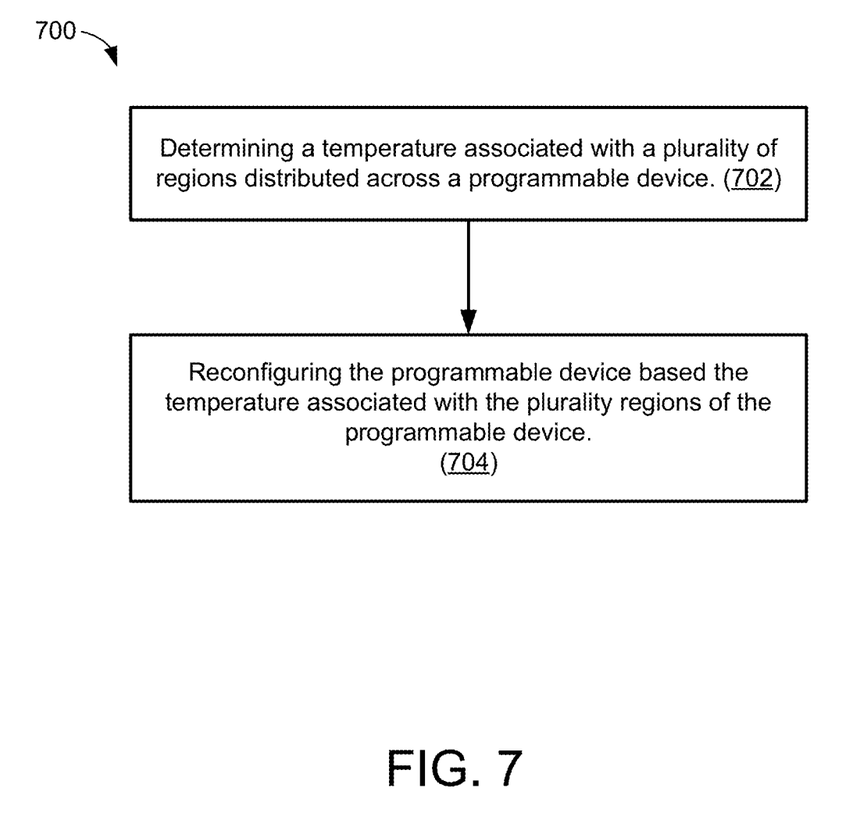
FIG. 7 is an illustrative flow chart depicting an example operation for reconfiguring a programmable device, in accordance with some implementations.

FIG. 7 is an illustrative flow chart depicting an example operation 700 for reconfiguring a programmable device, in accordance with some implementations. The example operation 700 is described below with respect to programmable device 100 and satellite monitor 192 of FIG. 1 for illustrative purposes only. It is to be understood that the example operation 700 may be performed by other programmable devices disclosed herein and/or by other suitable programmable and/or configurable devices.

The operation 700 may begin at block 702 by determining a temperature associated a plurality of regions distributed across a programmable device 100. In some aspects, determining the temperature may include measuring temperatures in and near regions associated with the satellite monitors 192. In some implementations, temperature data from the satellite monitors 192 may be received by the root monitor 310 of FIG. 3 or the processor 520. In some implementations, the temperature may be determined (measured) periodically.

The operation 700 may proceed at block 704 by reconfiguring the programmable device 100 based on the temperatures associated with the plurality of regions of the programmable device 100. In some implementations, the temperatures associated with the plurality of regions may be compared to one or more temperature thresholds. If one or more temperatures exceeds a threshold, then the programmable device 100 may be reconfigured with an alternative configuration file. The alternative configuration files may be stored within the configuration database 532 or within the bitstream storage device 550. In some aspects, the programmable device may be wholly or partially reconfigured.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example implementations have been described with reference to specific example implementations thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A method for operating a field programmable gate array (FPGA), comprising:
    determining, by a plurality of temperature sensors, a temperature associated with one or more regions of the FPGA;
    determining an alternative configuration for the FPGA based on the temperature associated with the one or more regions; and
    relocating functions performed by one or more first programmable regions of the FPGA to one or more second programmable regions of the FPGA based on the alternative configuration.

2. The method of claim 1, wherein the determining of the alternative configuration is performed in response to determining that a temperature associated with at least one region of the FPGA is greater than a temperature threshold.

3. The method of claim 2, wherein the temperature threshold associated with a first region of the FPGA is different from the temperature threshold associated with a second region of the FPGA.

4. The method of claim 1, wherein the determined alternative configuration is selected from a plurality of configuration files provided by a user.

5. The method of claim 1, wherein the FPGA is a system-on-a chip (SoC) device comprising:
    one or more scalar engines for performing numeric and procedural processing tasks;
    one or more adaptable engines for implementing programmable logic designs; and
    one or more intelligent engines for performing inference processing and machine learning tasks.

6. The method of claim 1, wherein the determined alternative configuration partially reconfigures the FPGA.

7. The method of claim 1, wherein the relocating comprises:
    dynamically relocating the functions performed by the one or more first programmable regions while the FPGA is operating in accordance with another configuration.

8. The method of claim 1, wherein determining the alternative configuration further comprises generating, by the FPGA, a configuration bitstream.

9. The method of claim 1, wherein a plurality of alternative configuration files describing one or more alternative configurations are stored within the FPGA.

10. A field programmable gate array (FPGA) comprising:
    a plurality of programmable regions, wherein each programmable region is configured to perform one or more functions; and
    a platform management controller coupled to the plurality of programmable regions and configured to:
        determine a temperature associated with one or more regions of the FPGA;
        determine an alternative configuration for the FPGA based on the temperature associated with the one or more regions; and
        relocate functions performed by one or more first programmable regions to one or more second programmable regions based on the alternative configuration.

11. The FPGA of claim 10, wherein the determination of the alternative configuration is performed in response to a determination that a temperature associated with at least one region of the FPGA is greater than a temperature threshold.

12. The FPGA of claim 11, wherein the temperature threshold associated with a first region of the FPGA is different from the temperature threshold associated with a second region of the FPGA.

13. The FPGA of claim 10, wherein the platform management controller is further configured to select the alternative configuration from a plurality of configuration files provided by a user.

14. The FPGA of claim 10, comprising:
    one or more scalar engines configured to perform numeric and procedural tasks;
    one or more adaptable engines configured to implement programmable logic designs; and
    one or more intelligent engines configured to perform inference processing and machine learning tasks.

15. The FPGA of claim 10, wherein the alternative configuration is to partially reconfigure the FPGA.

16. The FPGA of claim 10, wherein the platform management controller is further configured to dynamically relocate the functions performed by the one or more first programmable regions while the FPGA is operating in accordance with another configuration.

17. The FPGA of claim 10, wherein the platform management controller is further configured to generate a configuration bitstream based at least in part on the alternative configuration.

18. The FPGA of claim 10, wherein a plurality of alternative configuration files are stored within the FPGA.

19. The FPGA of claim 10, wherein the FPGA further comprises a plurality of temperature sensors, each of the temperature sensors being configured to determine the temperature associated with a respective one of the one or more regions of the FPGA.

20. A field programmable gate array (FPGA) comprising:
    means for determining a temperature associated with one or more regions of the FPGA;
    means for determining an alternative configuration for the FPGA based on the temperature associated with the one or more regions; and
    means for relocating functions performed by one or more first programmable regions of the FPGA to one or more second programmable regions of the FPGA based on the alternative configuration.

* * * * *